(12) United States Patent
Ioki et al.

(10) Patent No.: US 11,710,761 B2
(45) Date of Patent: Jul. 25, 2023

(54) DISPLAY APPARATUS

(71) Applicant: Mitsubishi Electric Corporation, Tokyo (JP)

(72) Inventors: Kazuhiro Ioki, Tokyo (JP); Hironobu Kawaguchi, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 207 days.

(21) Appl. No.: 17/018,380

(22) Filed: Sep. 11, 2020

(65) Prior Publication Data

US 2021/0134876 A1 May 6, 2021

(30) Foreign Application Priority Data

Oct. 31, 2019 (JP) .................... 2019-198543

(51) Int. Cl.
*H01L 27/15* (2006.01)
*H01L 33/58* (2010.01)
*G09F 27/00* (2006.01)

(52) U.S. Cl.
CPC .......... *H01L 27/156* (2013.01); *G09F 27/008* (2013.01); *H01L 33/58* (2013.01)

(58) Field of Classification Search
CPC ...... H01L 27/156; H01L 33/05; G09F 27/008
See application file for complete search history.

(56) References Cited

U.S. PATENT DOCUMENTS

2018/0106900 A1\* 4/2018 Droz ................. G01S 17/42
2019/0157247 A1\* 5/2019 Moosburger ........ H01L 25/0753

FOREIGN PATENT DOCUMENTS

| JP | H0850458 A | 2/1996 |
| JP | 2015102704 A | 6/2015 |
| JP | 2016109932 A | 6/2016 |

\* cited by examiner

*Primary Examiner* — Jay C Chang
*Assistant Examiner* — Mikka Liu
(74) *Attorney, Agent, or Firm* — Buchanan Ingersoll & Rooney PC (57) ABSTRACT

A display apparatus includes light-emitting elements configured to emit light in a screen, a louver fixed on the screen with a fastener, and a member disposed on a surface of the louver around the fastener and configured to reflect, in multiple directions, external light incident to a portion around the fastener or absorb the external light.

2 Claims, 5 Drawing Sheets

DISPLAY APPARATUS

CROSS-REFERENCE TO RELATED APPLICATION

This application claims the benefit of Japanese Patent Application No. 2019-198543, filed on Oct. 31, 2019, the entire disclosure of which is incorporated by reference herein.

FIELD

The present disclosure relates to a display apparatus.

BACKGROUND

Some known display apparatuses installed on outer walls of buildings or at indoor and outdoor sites of and gymnasiums or the like, are equipped with light emitting diodes (LEDs) arranged in a matrix on circuit boards. In order to prevent a reduction in visibility of the display apparatus due to a reduction in the contrast of an image displayed on a screen of the display apparatus due to reflection of external light such as sunlight or illumination light on the screen, the screen is provided with a louver for blocking external light. For example, Unexamined Japanese Patent Application Publication No. H08-50458 discloses a display apparatus including a louver that has four attachment holes. The louver is fixed to the screen by fastening screws serving as fasteners through these attachment holes.

SUMMARY

However, in the technique disclosed in the above-mentioned patent literature, portions of the louver around the fasteners for fixing the louver to the screen have flat shapes. These flat portions reflect external light incident to the flat portions. If this reflected light proceeds toward a viewer watching an image displayed on the display apparatus, the contrast of the image is reduced.

In consideration of circumstances such as those described above, an objective of the present disclosure is to prevent a reduction in the contrast of an image displayed on a display apparatus due to external light that is reflected on the surface of a louver around fasteners for fixing the louver on a screen and proceeds toward a viewer watching the image.

A display apparatus according to the present disclosure includes light-emitting elements configured to emit light in a screen, a louver fixed on the screen with a fastener, and a member disposed on a surface of the louver around the fastener and configured to reflect external light incident to a portion around the fastener in multiple directions or absorb the external light.

The display apparatus according to the present disclosure is provided with the member disposed on the surface of the louver around the fastener and configured to reflect, in multiple directions, external light incident to the portion around the fastener or absorb the external light. This configuration can reduce the reflected light proceeding to a viewer watching an image displayed on the display apparatus and thus prevent a reduction in the contrast of the image.

BRIEF DESCRIPTION OF THE DRAWINGS

A more complete understanding of this application can be obtained when the following detailed description is considered in conjunction with the following drawings, in which.

DETAILED DESCRIPTION

Display apparatuses according to embodiments of the present disclosure are described in detail below with reference to the accompanying drawings.

Embodiment 1

First, a display apparatus 1 according to Embodiment 1 is described with reference to FIGS. 1 to 3.

Figure 1:
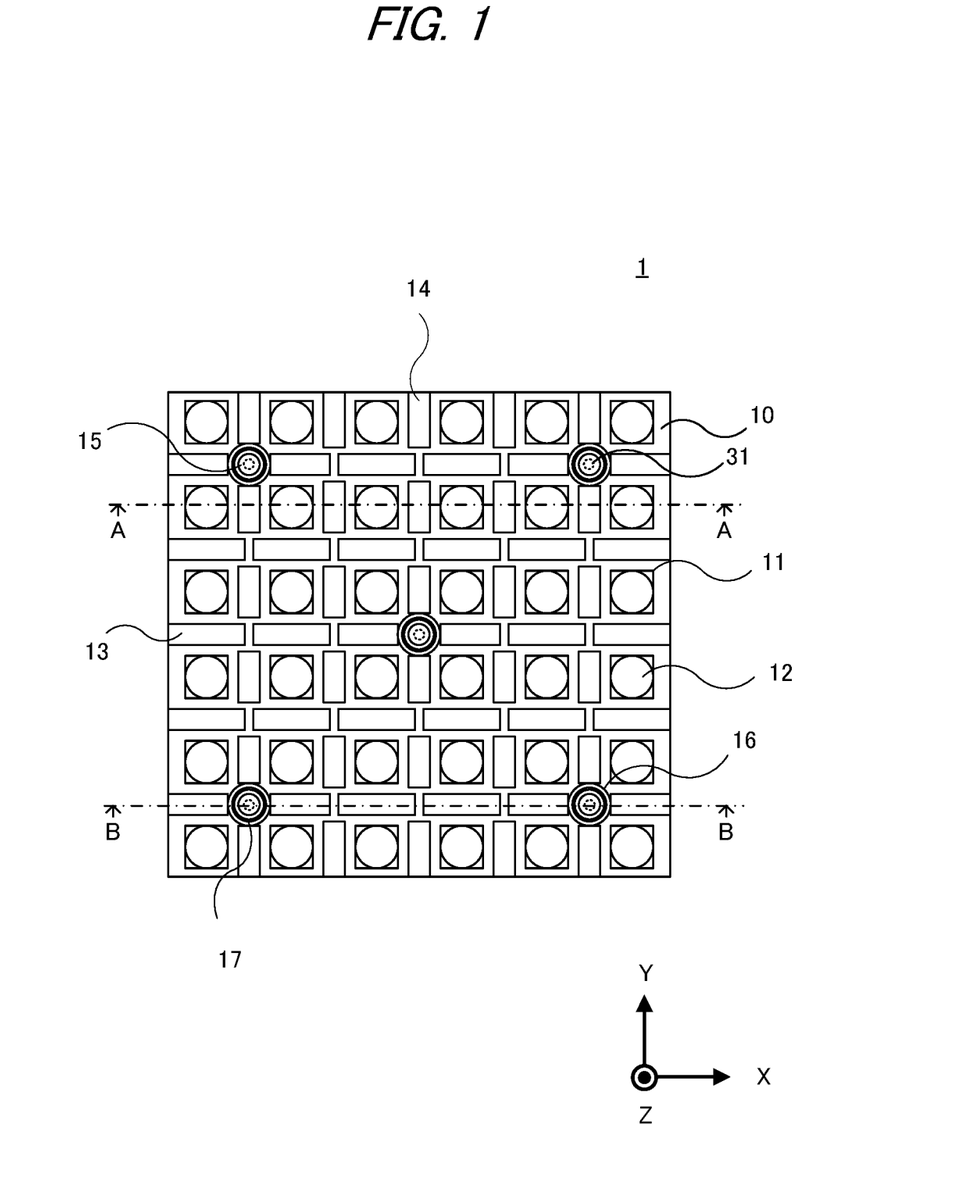
FIG. 1 is a front view of a display apparatus according to Embodiment 1 of the present disclosure.

As illustrated in FIG. 1, the display apparatus 1 is equipped with a screen that includes (i) a louver 10 for blocking external light to prevent the external light from directly falling on light sources and (ii) lenses 12 for light-emitting elements arranged in a matrix through openings 11 formed on the louver 10. The louver 10 includes (i) eaves 13 for blocking external light, (ii) partitions 14 for separating adjacent lenses 12, (iii) flat areas 16 provided around fasteners 15 used for attaching the louver 10 to the screen, and (iv) protrusions 17 that each have an annular shape and are provided around the fasteners 15. The arranged light-emitting elements emit light through the lenses 12, so that an image is displayed on the screen.

The following description assumes that the display apparatus 1 is installed in the position such that the front surface (screen) of the display apparatus 1 is vertical to the ground, in order to facilitate an understanding. The direction parallel to both the ground and the front surface of the display apparatus 1 is defined as X-axis direction (width direction of the display apparatus 1), the direction vertical to the ground is defined as Y-axis direction (height direction of the display apparatus 1), and the direction in which the front surface of the display apparatus 1 faces is defined as Z-axis direction. These directions are referenced as required in the following description.

Figure 2:
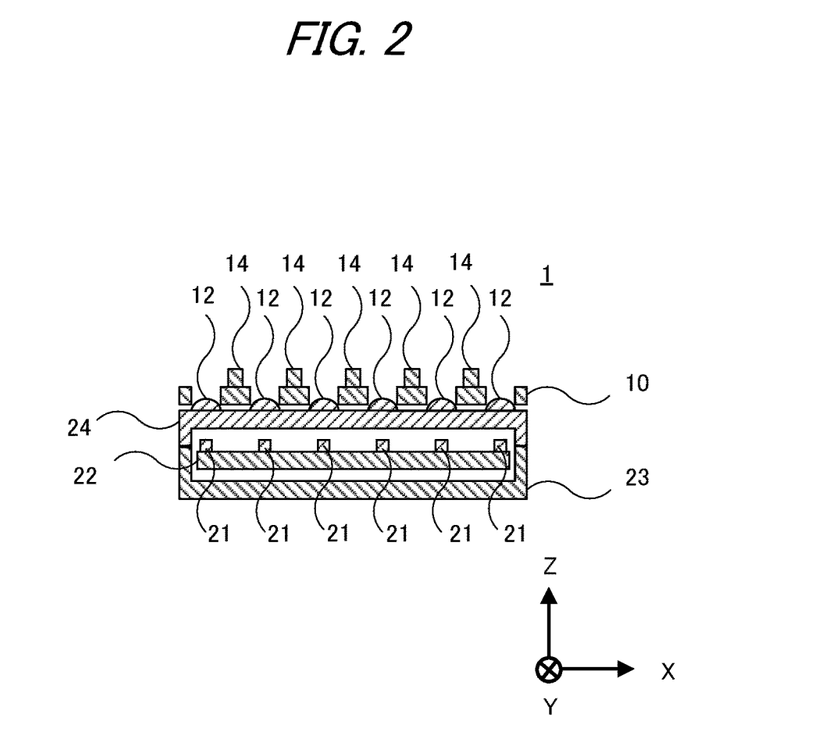
FIG. 2 is a cross-sectional view of the display apparatus in FIG. 1 as viewed along the line A-A.
Figure 3:
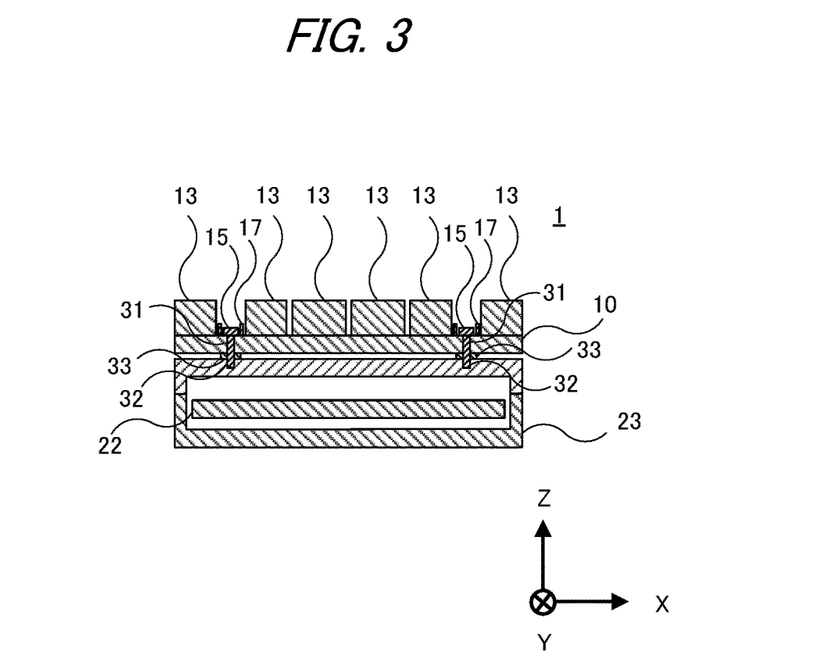
FIG. 3 is a cross-sectional view of the display apparatus in FIG. 1 as viewed along the line B-B.

As illustrated in FIG. 2 that is a cross-sectional view as viewed along the line A-A of FIG. 1, the display apparatus 1 includes (i) light-emitting elements 21 constituting pixels for displaying an image, (ii) a circuit board 22 on which the light-emitting elements 21 and various electronic components are mounted, (iii) a unit case 23 for accommodating various constituent components of the display apparatus 1, (iv) a lens case 24 provided with the lenses 12 for collecting light emitted from the light-emitting elements 21, and (v) the louver 10.

Each of the light-emitting elements 21 includes three light-emitting chips (LED chips) that emit red light, green light, and blue light. Emission intensities of the three light-emitting chips can be adjusted independently from one another by electric power supplied to each of the light-emitting chips via wires on the circuit board 22. Accordingly, the light-emitting element 21 can emit light with a freely-selected color at freely-selected strength. As a result, through the whole of light-emitting elements 21, the display apparatus 1 displays a color image.

The circuit board 22 is made of, for example, an insulating resin material, and the light-emitting elements 21 are mounted on a surface of the circuit board 22. The circuit board 22 includes non-illustrated wires for supplying electric power to the light-emitting elements 21. The circuit board 22 is also provided with a non-illustrated driving integrated circuit (IC) for driving the light-emitting elements 21 via the wires on the circuit board 22.

The unit case 23 serves as a housing of the display apparatus 1 and is provided with various components. The unit case 23 is made of a resin. The circuit board 22 is accommodated in the unit case 23 in the direction such that the light-emitting surfaces of the light-emitting elements 21 are exposed. The circuit board 22 is fastened or bonded to the unit case 23 with screws or an adhesive.

The lens case 24 is disposed at the position so as to cover the circuit board 22. The lens case 24 is a flat plate made of a transparent resin. The lens case 24 has embossed portions at the positions opposed to the light-emitting surfaces of the light-emitting elements 21. These embossed portions serve as the lenses 12. Each of the lenses 12 has a shape of circle or ellipse as viewed from the front. The surface provided with the lens 12 corresponds to the light-emitting surface of each light-emitting element 21. The light emitted from the three light-emitting diodes is made to exit via the lens 12 to the outside. The light-emitting element 21 emits light in any color via the lens 12 after adjustment of the respective emission intensities of the three light-emitting diodes. The lens 12 has a function of collecting the light emitted from the light-emitting element 21 and increasing the luminance of the display apparatus 1. As a result, through the whole of the light-emitting elements 21 arranged in a dot matrix, an image is displayed on the screen. The lens case 24 serves as a lid for enclosing the circuit board 22 accommodated in the unit case 23. The lens case 24 is fixed to the unit case 23, for example, by bonding the lens case 24 to the unit case 23 or by providing, on a lateral portion of the lens case 24, a fitting portion fitted to the unit case 23 and fitting the fitting portion to the unit case 23.

The louver 10 is a member mounted on the screen of the display apparatus 1 and used for blocking external light incident to the screen. The louver 10 includes, on a lattice-shaped flat plate, (i) the eaves 13 disposed between the rows of the light-emitting elements 21 and extending in the X-axis direction, and (ii) the partitions 14 disposed between the columns of the light-emitting elements 21 and extending in the Y-axis direction. The louver 10 is fabricated by, for example, injection molding of a black resin, such as a polycarbonate resin, acrylic resin, or epoxy resin. The louver 10 is made of a black resin and thus has a low reflectance of external light.

The lattices of the louver 10 serve as the openings 11 through which the light-emitting elements 21 are exposed via the lens case 24. Each of the openings 11 may have, for example, a circular or elliptical shape in accordance with the shape of the lens 12. These lattices prevent light from leaking to the adjacent light-emitting elements 21.

The eaves 13 are disposed, in the X-axis direction, between the light-emitting elements 21 adjacent in the Y-axis direction on the flat plane. The eaves 13 protrude in the Z-axis direction and partially surround the light-emitting elements 21. The eaves 13 block external light to prevent the external light from directly falling on the light-emitting elements 21. The eaves 13 are provided for the respective light-emitting elements 21 constituting the pixels. Every two eaves 13 adjacent in the X-axis direction have a notch therebetween. Each of the eaves 13 has a linear shape. Alternatively, the eave 13 may have an arc shape that surrounds the light-emitting element 21 so as to block external light incident from diagonally above in the Y-axis direction to the light-emitting element 21. The eave 13 is shaped as a quadrangular prism. Alternatively, the eave 13 may be shaped as a pyramid that is tapered in the Z-axis direction.

The louver 10 also has partitions 14 that are disposed between the columns of the light-emitting elements 21 and extend in the Y-axis direction. The partitions 14 are disposed, in the Y-axis direction, between the light-emitting elements 21 adjacent in the X-axis direction on the flat plane. The partitions 14 are provided for the respective light-emitting elements 21 constituting the pixels. Every two partitions 14 adjacent in the Y-axis direction have a notch therebetween. The partitions 14 are provided to prevent light emitted from a light-emitting element 21 from leaking to the adjacent light-emitting elements 21. The partitions 14 have heights shorter than the heights of the eaves 13.

As illustrated in FIG. 1, the louver 10 has attachment holes 31 at the positions indicated by the dashed lines in the flat areas 16. The louver 10 is fastened to the screen with the fasteners 15 via the attachment holes 31 and is fixed to the display apparatus 1. The fasteners 15 are, for example, screws for fixing objects through fastening. Examples of the screws include vises and bolts. Each of the attachment holes 31 is provided on the flat area 16 that is located at the center of four light-emitting elements 21 adjacent in the X- and Y-axis directions. On the flat area 16 around the fastener 15, the eaves 13 have notches and the partitions 14 have notches so as to enable attachment via the fastener 15. As illustrated in FIG. 3 that is a cross-sectional view as viewed along the line B-B of FIG. 1, the lens case 24 has fixation holes 32 at the positions corresponding to the respective attachment holes 31 of the louver 10. A spacer 33 is disposed between each attachment hole 31 of the louver 10 and the corresponding fixation hole 32 of the lens case 24. The fastener 15 is inserted through the attachment hole 31 of the louver 10, the spacer 33, and the fixation hole 32 of the lens case 24, and the louver 10 is fixed and attached to the lens case 24, for example, by screwing.

The flat area 16 of the louver 10 around the fastener 15 includes a protrusion 17 at a sufficiently distant position so as to enable attachment via the fastener 15. A portion of the protrusion 17 surrounding the head of the fastener 15 has an annular shape, as illustrated in FIG. 1, and the protrusion 17 protrudes in the Z-axis direction. In this case, such an annular shape has only to be a freely-selected annular shape such as an ellipse or distorted circle, and the annular shape is limited to a perfect circle. The protrusions 17 have heights shorter than the heights of the eaves 13 and the partitions 14. The protrusions 17 are formed integrally with the louver 10. The protrusions 17 block external light incident to the flat areas 16 around the fasteners 15, and each of the protrusions 17 has an annular lateral surface. Accordingly, the protrusions 17 reflect external light, in multiple directions, to the outside of the sight of a viewer watching an image on the screen. The protrusion 17 is an example of the member configured to reflect external light incident to the portion around the fastener 15 in multiple directions. This configuration prevents a reduction in the contrast of an image and thus prevents a reduction of visibility. In addition, the protrusion 17 blocks external light incident to the head of the fastener 15, thereby reducing light reflected from the head of the fastener 15. This configuration also prevents a reduction in the contrast of an image. Since the eaves 13 and the partitions 14 have notches on the flat area 16 around the fastener 15, it is more likely that, on the flat area 16 around the fastener 15, external light falls on the adjacent light-emitting elements 21 through the notches and light emitted from a light-emitting element 21 leaks to the adjacent light-emitting elements 21, as compared with other areas. However, the protrusion 17 is provided to shield the notches. Accordingly, the protrusion 17 prevents external light from falling on the light-emitting element 21 and prevents light emitted from the light-emitting element 21 from leaking to the adjacent other light-emitting elements 21. The shape of the protrusion 17 is not limited to the perfect circle and may also be a shape of an ellipse or distorted circle. This configuration can reduce the required accuracy of the die and lower the costs for producing the die. The height of protrusion 17, that is, length in the Z-axis direction, is not necessarily a uniform all around the circumference. The +Y-axis directional-side portion of the protrusion 17 may have a length in the Z-axis direction longer than that in the other portions. For example, the length in the Z-axis direction of the protrusion 17 increases in the +Y-axis direction. This configuration can efficiently reflect light incident from diagonally above to the screen, such as, for example, sunlight or illumination light. Also, the protrusions 17 may be formed separately from the louver 10 and attached to the louver 10. Also, the eaves 13 and the partitions 14 may be formed integrally with the flat areas 16 of the louver 10, or may be formed separately from the louver 10 and attached to the louver 10 by bonding, crimping or screwing.

Embodiment 2

Figure 4A:
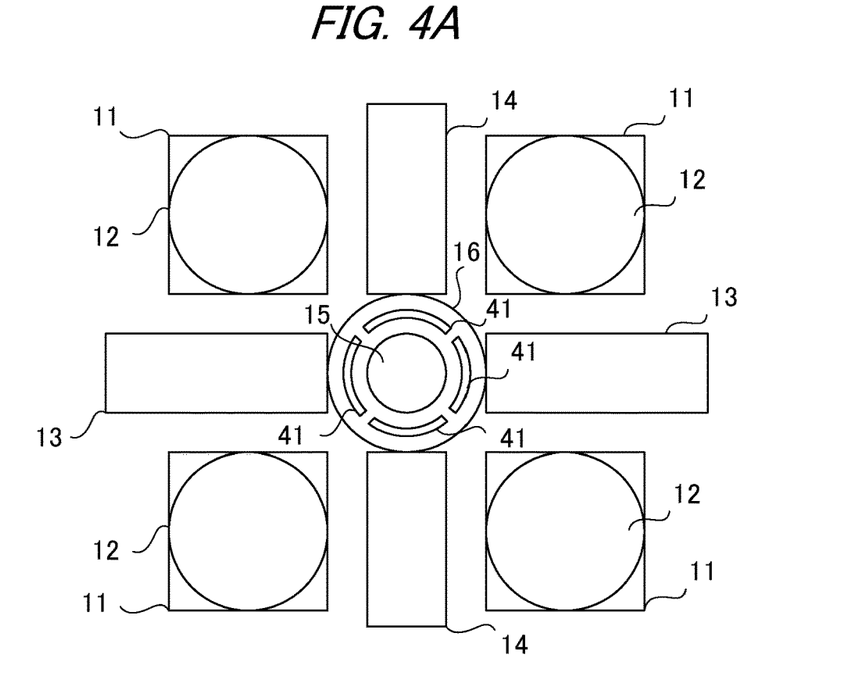
FIG. 4A illustrates a portion of a screen of a display apparatus according to Embodiment 2 of the present disclosure.

According to Embodiment 2, as illustrated in FIG. 4A, the flat area 16 around each fastener 15 is provided with arc protrusions 41, in place of the annular protrusion 17. These arc-shaped protrusions 41 block external light incident to the flat area 16 around the fastener 15 and the head of the fastener 15. The arc-shaped surfaces of the protrusions 41 reflect external light, in multiple directions, to the outside of the sight of a viewer watching an image on the screen. The protrusions 41 are an example of the member configured to reflect external light incident to the portion around the fastener 15 in multiple directions. This configuration prevents a reduction in the contrast of an image and thus avoids a reduction in visibility.

Also, although it is considered that a fastening force of the fastener 15 during an attachment operation with the fastener 15 may cause distortion of the louver 10 around the fastener 15, this distortion can be absorbed by notches formed between the protrusions 41. Spaces between the adjacent protrusions 41 also enable visual confirmation of the attached portions during attachment or detachment of the fastener 15 and thus facilitate the operation. Although four protrusions 41 are formed in FIG. 4A, the present disclosure is not limited to such a configuration, and the number of the formed protrusions 41 is a freely-selected number. The protrusions 41 may be different from one another in length in the X-axis direction, height in the Z-axis direction, curvature and the like. For example, in a case in which the external light is sunlight, since the sunlight is incident from diagonally above to the screen, the protrusion 41 disposed above the fastener 15 in the Y-axis direction is configured to have a longer length in the X-axis direction and a higher height in the Z-axis direction than those of the other protrusions 41. Also, distances between positions at which the protrusions 41 are arranged can be set to be freely-selected distances for each of the protrusions 41. For example, the protrusions 41 may be disposed such that two adjacent protrusions 41 are different from each other in distance from the center of the fastener 15 and have partially-overlapped angles about the center of the fastener 15.

Figure 4B:
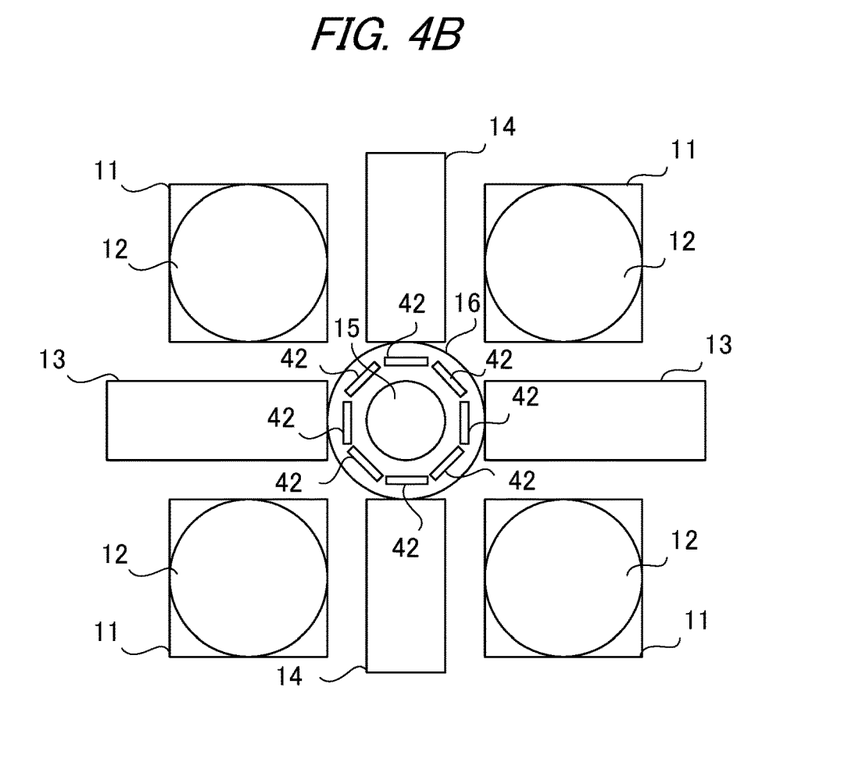
FIG. 4B illustrates a portion of a screen of another display apparatus according to Embodiment 2 of the present disclosure.

Alternatively, as illustrated in FIG. 4B, the flat area 16 around each fastener 15 may be provided with linear protrusions 42, in place of the protrusions 41. These linear protrusions 42 are disposed at mutually different angles so as to surround the fastener 15. The linear protrusions 42 block external light incident to the flat area 16 around the fastener 15 and the head of the fastener 15. The flat surfaces of the protrusions 42 reflect external light, in multiple directions, to the outside of the sight of a viewer watching an image on the screen. The protrusions 42 are an example of the member configured to reflect external light incident to the portion around the fastener 15 in multiple directions. This configuration prevents a reduction in the contrast of an image and thus avoids a reduction in visibility. Although the flat area 16 has eight protrusions 42 in FIG. 4B, the present disclosure is not limited to such a configuration, and a freely-selected number of protrusions 42 can be formed. Also, Lengths of the protrusions 42 in the X-axis direction, heights of the protrusions 42 in the Z-axis direction, and distances between positions at which adjacent protrusions 42 are arranged can be respectively set to be freely-selected lengths, freely-selected heights, and freely-selected distances.

Embodiment 3

Figure 5:
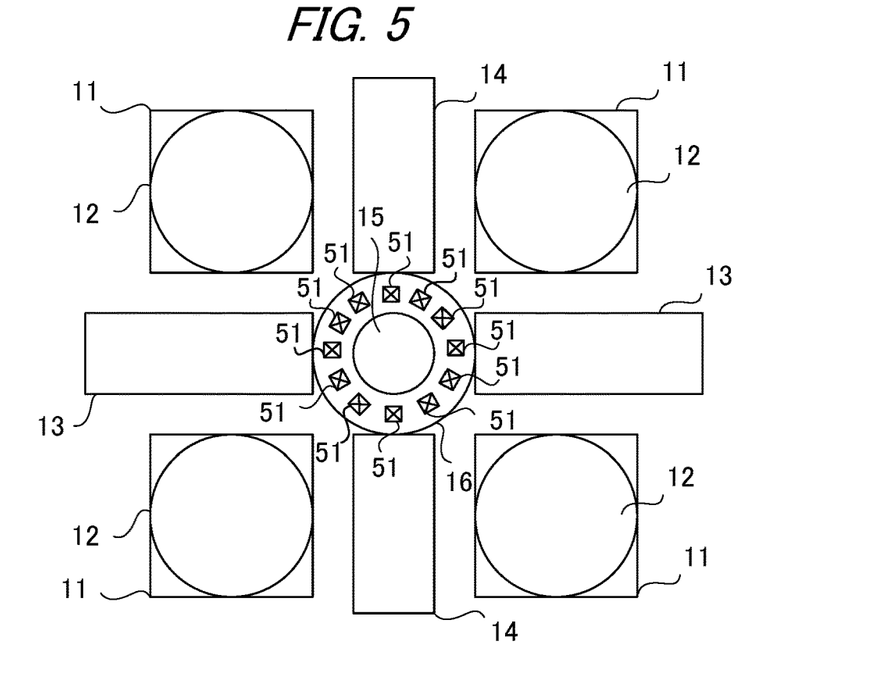
FIG. 5 illustrates a portion of a screen of a display apparatus according to Embodiment 3 of the present disclosure.

According to Embodiment 3, as illustrated in FIG. 5, the flat area 16 around each of the fasteners 15 is provided with protrusions 51 that are shaped as a pyramid. In this case, a quadrangular pyramid is illustrated as an example of the pyramid in FIG. 5. The pyramid-shaped protrusions 51 disposed around the fastener 15 block external light incident to the flat area 16 around the fastener 15 and the head of the fastener 15. Pyramid-shaped surfaces of the protrusions 51 reflect external light, in multiple directions to the outside of the sight of a viewer watching an image on the screen. The protrusions 51 are an example of the member configured to reflect external light incident to the portion around the fastener 15 in multiple directions. This configuration prevents a reduction in the contrast of an image and thus avoids a reduction in visibility. Also, by forming the protrusions 51 as a pyramid-shaped protrusion, the area of opening around the fastener 15 is made to increase in the +Z-axis direction. Accordingly, this configuration facilitates attachment of the fastener 15. Also, by providing the multiple pyramid-shaped protrusions 51, distortion that occurs during fastening of the fastener 15 can be absorbed. Examples of the pyramid include not only the quadrangular pyramid but also polygonal pyramids, such as a triangular pyramid and pentagonal pyramid. The pyramid may be a cone. The examples of the pyramid also include a pyramid that have a tip having a curved or flat surface. The protrusions may have a freely-selected shape and may be freely arranged in consideration of, for example, shading properties and water-drainage properties in case of rain. For example, the pyramid-shaped protrusions 51 may be combined with the arc protrusions 41 and the linear protrusions 42.

Embodiment 4

Figure 6:
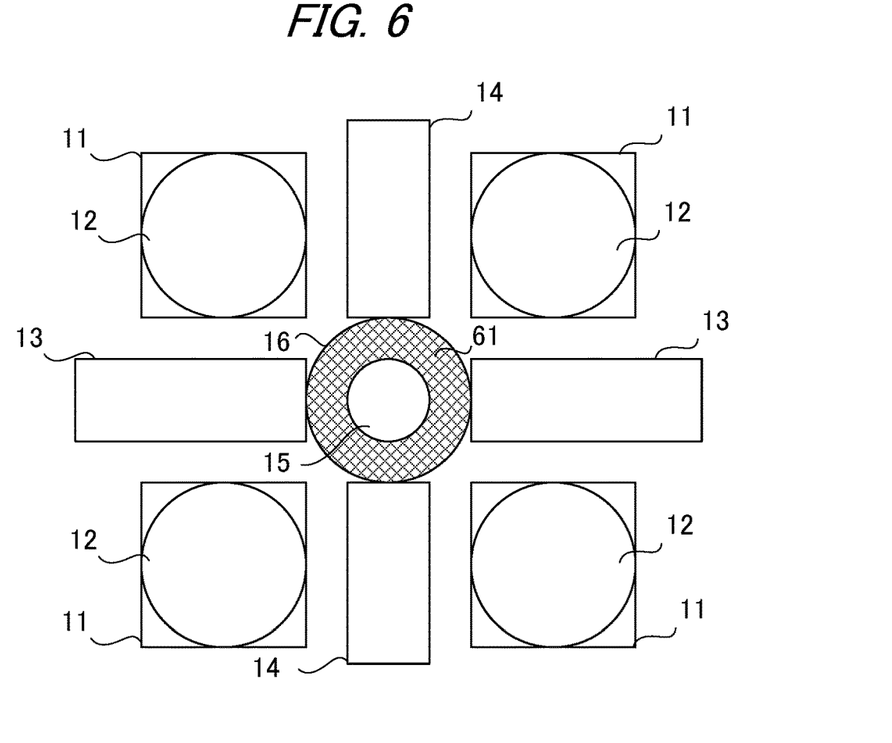
FIG. 6 illustrates a portion of a screen of a display apparatus according to Embodiment 4 of the present disclosure.

According to Embodiment 4, as illustrated in FIG. 6, the flat area 16 around each fastener 15 is provided with an uneven area 61 that has an uneven surface on which micro protrusions and recesses are formed by a sand-blast process. This surface having micro protrusions and recesses of the uneven area 61 around the fastener 15 irregularly reflects external light incident to the flat area 16 around the fastener 15, and thus the surface reflects external light, in multiple directions, to the outside of the sight of a viewer watching an image on the screen. The uneven area 61 is an example of the member configured to reflect external light incident to the portion around the fastener 15 in multiple directions. The uneven area 61 suppresses reflection of incident external light, thereby improving the contrast of an image. The uneven area 61 has only to have a shape enabling irregular reflection of external light and may have a satin-finished surface or embossed surface. The head of the fastener 15 exposed to the screen may also have the uneven area 61.

Embodiment 5

Figure 7:
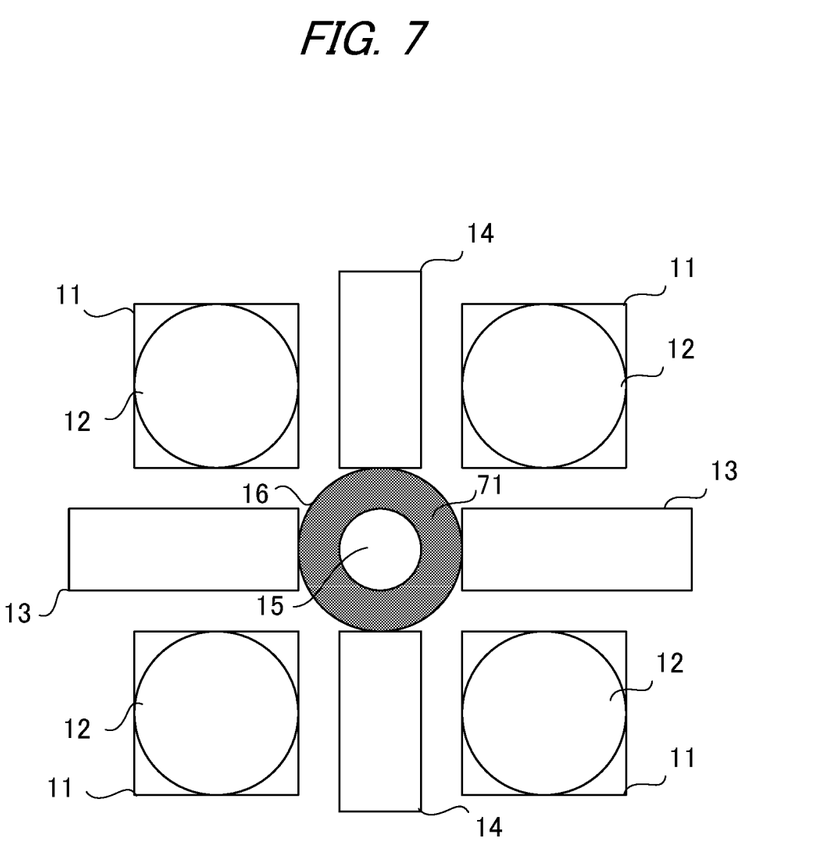
FIG. 7 illustrates a portion of a screen of a display apparatus according to Embodiment 5 of the present disclosure.

According to Embodiment 5, as illustrated in FIG. 7, the flat area 16 around each fastener 15 is provided with an anti-reflection member 71. The anti-reflection member 71 absorbs external light incident to the portion around the fastener 15 and suppresses reflection of external light. The anti-reflection member 71 is made of a thin film, a metal plate or the like. Other method of producing the anti-reflection member 71 includes a method in which a coating is applied to the flat area 16 around the fastener 15. The surface of the anti-reflection member 71 is preferably subject to an anti-reflection treatment for suppressing reflection of external light, such as, for example, embossing or matte coating. The anti-reflection member 71 suppresses reflection of incident external light, such as sunlight, thereby improving the contrast of an image. The anti-reflection member 71 has a dark color and has a capability of absorbing visible light. The dark color may be an achromatic color or chromatic color. Also, the anti-reflection member 71 is fabricated by adding a black colorant such as carbon black to a flexible thin film made of a waterproof resin such as polyester resin, polycarbonate resin, acrylic resin, or silicone resin. A change of an amount of the added colorant makes it possible to adjust a visible-light absorption rate to a desired value. Additionally, the head of the fastener 15 exposed to the screen may be also made to have the anti-reflection member 71. This configuration can suppress reflection of external light incident to the head of the fastener 15. Furthermore, the flat area 16 around each fastener 15 may be provided with the anti-reflection member 71 in addition to a configuration in which the protrusions 17, 41, 42, or 51 according to any of Embodiments 1 to 3 are disposed around the fastener 15. The surfaces of the protrusions may also be composed of the anti-reflection member 71.

Although the screws are described as an example of the fasteners 15 in the above-described embodiments, the fasteners 15 have only to elements for fixing an object, and the fasteners 15 are not limited to the screws. For example, the fasteners 15 may be rivets or nails.

Also, the surface mount LEDs are used as the light-emitting elements 21 in the above-described embodiments. For example, the light-emitting elements 21 may also be bullet LEDs.

Also, although the louver 10 is fixed to the lens case 24 with the fasteners 15 in the above-described embodiments, the louver 10 may also be fixed and attached to the circuit board 22 or to the unit case 23. In particular, in the case where each package of the light-emitting elements 21 is provided with a lens and the light-emitting elements 21 are bullet light-emitting elements, the configuration includes no lens case 24. The louver 10 may be fixed to any member if the louver 10 can be attached and fixed to the screen.

Also, although the screen has a square shape in each of the above-described embodiments, the screen may also have other shape such as a rectangular or a circular shape.

Also, although each light-emitting element 21 is configured as a single package including light-emitting diodes that emit three colors in each of the above-described embodiments, the present disclosure is not limited to such a configuration. For example, the light-emitting element 21 may be composed of a single light-emitting diode or two light-emitting diodes. Also, the light-emitting element 21 may be configured as a single package including four or more light-emitting diodes.

Also, although the light-emitting elements 21 including light-emitting diodes of three colors of blue, red, and green are arranged in a dot matrix in each of the above-described embodiments, the present disclosure is not limited to such a configuration. As long as the light-emitting elements 21 are regularly arranged, the present disclosure is not limited to the lattice arrangement of the light-emitting diodes 21. In addition, for example, each light-emitting element 21 may be composed of a light-emitting diode that emits a single color selected from red, blue, and green.

The above-described embodiments can be applied to, in particular, a large display installed at an outdoor site and configured by arrangement of a large number of light-emitting elements. The embodiments may also be applied to an image display apparatus installed at an indoor site as well as an outdoor site. This configuration can also prevent glare due to external light from occurring on the screen on which an image is displayed.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

What is claimed is:

1. A display apparatus comprising:
   light-emitting elements configured to emit light in a screen;
   a louver fixed on the screen with a fastener; and
   a member disposed on a surface of the louver around the fastener and configured to reflect external light in multiple directions or absorb the external light, the external light being incident to a portion around the fastener wherein the member is an annular protrusion surrounding the fastener.

2. A display apparatus comprising:
   light-emitting elements configured to emit light in a screen;
   a louver fixed on the screen with a fastener; and
   a member disposed on a surface of the louver around the fastener and configured to reflect external light in multiple directions or absorb the external light, the external light being incident to a portion around the fastener wherein the member is an anti-reflection member disposed on the surface of the louver around the fastener.

* * * * *